United States Patent
Miller et al.

(10) Patent No.: US 6,384,696 B1
(45) Date of Patent: *May 7, 2002

(54) MULTIPLEXER FOR SORTING MULTIPLE SIGNALS FROM AN ANTENNA

(75) Inventors: Paul E. Miller, Spring Lake; Paul A. Bogdans, Grand Haven, both of MI (US); Glen J. Seward, Cincinnati, OH (US)

(73) Assignee: R.A. Miller Industries, Inc., Grand Haven, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/568,211

(22) Filed: May 9, 2000

Related U.S. Application Data (63) Continuation-in-part of application No. 09/420,233, filed on Oct. 19, 1999, which is a continuation-in-part of application No. 08/929,142, filed on Sep. 10, 1997, now Pat. No. 6,107,972, which is a continuation-in-part of application No. 08/615,607, filed on Mar. 13, 1996, now Pat. No. 5,734,352, which is a continuation-in-part of application No. 08/452,079, filed on May 26, 1995, now abandoned, which is a continuation of application No. 08/092,508, filed on Jul. 16, 1993, now abandoned, which is a continuation-in-part of application No. 07/926,905, filed on Aug. 7, 1992, now abandoned.

(51) Int. Cl.$^7$ .............................. H03H 7/46; H01Q 1/00
(52) U.S. Cl. ........................................ 333/132; 343/722
(58) Field of Search ........................ 333/132; 343/722; 370/915, 916

(56) References Cited

U.S. PATENT DOCUMENTS

| | | | |
|---|---|---|---|
| 3,725,942 A | 4/1973 | Ukmar | 343/715 |
| 4,085,405 A | 4/1978 | Barlow | 343/358 |
| 4,095,229 A | 6/1978 | Elliott | 343/715 |
| 4,097,867 A | 6/1978 | Eroncig | 343/715 |
| 4,106,025 A | 8/1978 | Katz | 343/715 |
| 4,117,493 A | 9/1978 | Altmayer | 343/750 |
| 4,141,016 A | 2/1979 | Nelson | 343/858 |
| 4,157,547 A | 6/1979 | Freimark et al. | 455/74 |
| 4,222,053 A | 9/1980 | Newcomb | 343/722 |
| 4,229,743 A | 10/1980 | Vo et al. | 343/749 |
| 4,404,564 A | 9/1983 | Wilson | 343/750 |
| 4,940,989 A | 7/1990 | Austin | 343/749 |
| 5,057,849 A | 10/1991 | Dörrie et al. | 343/722 |
| 5,089,829 A | 2/1992 | Haruyama et al. | 343/852 |
| 5,258,765 A | 11/1993 | Dörrie et al. | 343/722 |
| 5,451,967 A | 9/1995 | Ueda et al. | 343/722 |
| 5,734,352 A | 3/1998 | Seward et al. | 343/722 |

*Primary Examiner*—Robert Pascal
*Assistant Examiner*—Kimberly E Glenn
(74) *Attorney, Agent, or Firm*—McGarry Bair LLP (57) ABSTRACT

A multiplexer circuit adapted to receive signals comprises two filter circuits. The first filter circuit presents a high impedance to signals outside a first frequency range and the second circuit presents a high impedance to signals outside a second frequency range. Isolation matching circuits enable transmission and reception of one of the signals in the first or second frequency ranges without degradation or interference with the other range. An embodiment allows transmission and reception of satellite Orbcomm frequencies over a standard AM/FM antenna without effect on the AM/FM signal.

3 Claims, 5 Drawing Sheets

MULTIPLEXER FOR SORTING MULTIPLE SIGNALS FROM AN ANTENNA

RELATED APPLICATIONS

This is a continuation-in-part of Application Ser. No. 09/420,233, filed Oct. 19, 1999, now pending, which is a continuation-in-part of Application Ser. No. 08/929,142, filed Sep. 10, 1997, now U.S. Pat. No. 6,107,972, which is a continuation-in-part of Application Ser. No. 08/615,607, filed Mar. 13, 1996, now U.S. Pat. No. 5,734,352, which is a continuation-in-part of Application Ser. No. 08/452,079, filed May 26, 1995, now abandoned, which is a continuation of Application Ser. No. 08/092,508, filed Jul. 16, 1993, now abandoned, which is a continuation-in-part of Application Ser. No. 07/926,905, filed Aug. 7, 1992, now abandoned.

BACKGROUND OF THE INVENTION

1. Field of the Invention

The invention pertains to antennas and multiplexers and more particularly to multiplexers for use with antennas and receiving apparatus operating in the AM, FM, CB, weather band (WB), cellular telephone, and/or other specialized frequency ranges.

2. Prior Art

Multiband antennas that simultaneously serve as antennas for AM/FM broadcast radio and for Citizen Band (CB) transceivers are known. A problem in designing antennas of this type is to define an antenna which has near optimal receiving/transmission capabilities in several separate frequency bands. For example, the AM radio band falls in the comparatively low frequency range of 550 to 1700 kHz while FM radio operates in the 88 to 108 MHz range and CB operates in the relatively narrow range of 26.95 to 27.405 MHz. Cellular telephone operates in a frequency band of 825 to 890 MHz. It is well known from antenna design principles that a commonly used electrical length for a rod antenna used with a ground plane is one-quarter of the wavelength of the transmitted signal. Thus, there is a design conflict when a single antenna is used for several frequency ranges. One option used in prior art antenna design is to tune the antenna to the separate frequencies when switching between bands. This has obvious disadvantages to the user of the radio, using impedance matching networks. Another option is to design an antenna which provides a compromise and is usable in several frequency bands. Such an antenna, by its nature, provides near optimal reception in at most one frequency range. For example, it is not uncommon in automobile antennas to use an antenna length equivalent to one-quarter wavelength to the midpoint of the FM range. As a consequence, the lower frequency AM reception is not optimum but is acceptable. However, such an antenna is unacceptable for use with a cellular or CB transceiver. Similarly, a CB antenna does not provide adequate FM or cellular reception.

In automobiles and trucks, it is common to use one antenna for CB and another for AM/FM/WB and a third for cellular telephone and even a fourth for other specialized frequencies. Trucks typically use a pair of CB antennas connected in parallel and through a T-connection to the CB radio equipment. The antennas are often mounted on the side view mirrors on both sides of the cab which, because of their location outside of the cab and beyond the sides of the trailer or box behind the cab, provide a favorable signal reception position. It is not feasible, however, to put separate AM/FM/WB, cellular and CB antennas on the mirrors because of space and interference considerations. Consequently, these antennas have typically been placed in various locations on the vehicle with less than satisfactory signal reception or transmission. For example, reception or transmission for FM and cellular telephone antennas mounted on the roof of a truck cab is often blocked by the box of the truck.

A significant problem in multiple antenna systems of the prior art is the mismatch in electrical characteristics between the two separate antennas of a dual antenna system and the mismatch between the antennas and the radio equipment. Such mismatches result in a loss of power and can cause damage to the radio equipment due to reflected energy. The loss of power is particularly noticeable in fiberglass cabs which lack the standard ground plane.

U.S. Pat. No. 4,229,743 to Vo et al., issued Oct. 21, 1980, discloses a multiband AM/FM/CB antenna having a plurality of resonant frequencies. This prior art antenna uses coil sections wound around portions of the antenna to form a network. The network is used to provide an impedance element having a resonant frequency at approximately 59 MHz. This is an approximate midpoint between the CB and FM band and does not provide optimal reception in the two separate bands.

U.S. Pat. No. 5,057,849 to Dorrie et al., issued Oct. 15, 1991, discloses a rod antenna for multiband television reception. That antenna uses a support rod with two connected windings wound on the rod, one of the windings being spiraled with wide turns and the other being tightly wound. The two windings are capacitively coupled to the antenna connection element by a loop of a third winding. This antenna, when connected to a television receiver, allows the receiver to be switched between UHF and VHF without requiring specific tuning of the antenna. The antenna, however, does not provide optimal reception of two separate frequency bands.

Frequency self-resonant circuits have been used by amateur radio operators to be able to use the same antenna for more than one frequency band. Such known frequency self-resonant circuits customarily consist of a coil in the antenna with a discrete capacitor connected across the coil and external to the coil. Together, the coil and capacitor form an L-C circuit which presents a high impedance at a selected frequency to effectively isolate a portion of the antenna at the selected frequency. Such an arrangement with discrete capacitors is not practical for automotive antennas and other applications.

U.S. Pat. No. 4,404,564 to Wilson, issued Sep. 13, 1983, discloses an omni-directional antenna in which the electrically conductive antenna element is wound around a rod of insulating material and a tuning device comprising a hollow cylinder of non-conductive material mounted on the antenna rod and a metallic sleeve around a portion of the cylinder and an outer coil electrically isolated from the sleeve and the antenna conductor. Such an arrangement does not provide the desired frequency band separation.

U.S. Pat. No. 4,22,053 to Newcomb, discloses an amateur radio antenna constructed of a plurality of telescoping, overlapping tubular sections. The antenna includes a self-resonant circuit comprising a coiled wire section having opposite ends electrically connected to two different telescoping tubular sections which are electrically insulated from each other. The self-resonant circuit has an inductive component provided by the wire coil and a capacitive component provided by the overlapping tubular sections, with the overlapping tubular sections essentially acting as plates of a capacitor. Such overlapping tubular section antennas work well as stationary antennas but are not acceptable for motor vehicle antennas, particularly where relatively long antennas are required, such as for CB transmission and reception. A problem with such prior art multi-band antennas is that the antennas are bulky, have too much wind resistance for use on motor vehicles and are not aesthetically pleasing.

Antennas which serve both for cellular telephone and CB are not generally known among commercially available antennas. The difference in operating frequency between the cellular telephone and CB radio is sufficiently great that the designer of a cellular telephone antenna faces an entirely different set of problems than the designer of a CB antenna. The CB antenna operates in a range where a quarter wavelength is approximately 9 feet while the cellular antenna must operate in a frequency range where a quarter wavelength is approximately 3.3 inches. CB antennas are commonly used on trucks and mounted on side mirrors which are spaced apart by approximately 9 feet, or one-quarter wavelength in the CB range to provide and enhance that radiation pattern. Combining a cellular antenna with a CB antenna at that spacing could result in a signal cancellation instead of signal enhancement, depending on the existing ground plane surface. However, a need for a single antenna structure which would serve as an AM/FM/CB/cellular radio antenna has existed for some time. It is recognized that the manufacturer of a single antenna structure is more cost effective both in manufacture and installation and maintenance on the vehicle than a plurality of antennas. Placement and mounting of a plurality of antennas requiring the drilling holes and separate wiring adds to the expense and inconvenience of a proliferation of antennas on a vehicle.

Vehicles such as large trucks typically have a CB transmitter/receiver in addition to an AM/FM/WB receiver, connected to one or more antennae. It is common to add WB frequency coverage to truck and upscale automotive AM/FM automobile radios. This allows a listener to switch the AM/FM/WB radio receiver to weather band frequencies at around 162 MHz to obtain local weather reports. The weather frequencies are relative close to the upper ranges of the FM band that extends to 108 MHz. This allows FM frequency antennas to provide adequate WB reception.

In more recent years, WB frequency range has been added to as a feature to many CB radio sets. In addition, such combination typically includes additional circuitry for detection of alert signals transmitted by weather broadcasting stations in case of severe weather. The alert signal detection circuitry is designed to automatically switch the CB transceiver to the WB broadcast. Since CB and WB both operate within a relatively narrow frequency band, spaced apart from each other, WB reception on CB is typically poor, there is a need for improved WB signal reception on the CB transceiver.

In one prior art arrangement, a weather band frequency trap in the form of a standard coil is added to the CB frequency antenna. However, such a trap adds to the expense of the antenna and, in many prior art antennas, the additional coil tends to weaken the CB antenna performance. Separate antennas are still required to provide AM/FM reception and weather band reception, when weather band reception is received through the AM/FM/WB receiver.

The well-known and widely used cellular telephone system operates within a specified frequency, e.g., 825 to 890 MHz and may use analog or digital transmission between a telephone and a cell site connected to a telephone network. A more recently developed Personal Communication Service (PCS) is a cellular system primarily designed for use in more densely populated urban areas and operates in a higher frequency range of 1850 to 1990 MHz. The standard cellular system is designed primarily for use in relatively open areas and does not function well in congested metropolitan areas where cellular signals may be blocked by buildings and other obstacles. One advantage of PCS is that it operates at a higher frequency with about 10% of the power consumption of a conventional cellular system. Consequently, smaller broadcast antennae are needed, a clear benefit in congested urban areas where conventional cellular towers are impractical. There is also less of a problem with polarization. With aggressive marketing, the demand for PCS capability is increasing.

Dual-band cellular phones are now available that operate at either standard or PCS frequencies and are designed to automatically switch from standard cellular to PCS frequencies when the PCS signal is stronger.

A disadvantage of hand-held portable cellular phones is that they are provided with a relatively small antenna and do not operate optimally when used in a metallic enclosure, such as a typical car or truck. Many vehicles, particularly long-haul trucks, are equipped with a cellular antenna to which a cellular phone may be connected for communication at the standard cellular frequency. A problem with such installations is that signals at the higher PCS frequencies cannot be adequately received or transmitted via the standard cellular antenna. As a result, a person using a cellular phone connected to such a cell phone antenna and entering a congested metropolitan area may lose the standard cellular signal. In order to pick up a PCS signal in the area, the user must physically disconnect the telephone from the cell phone antenna and resort to the antenna on the hand-held portable cellular phone to receive and transmit PCS signals. However, in a metallic enclosure such as a car, the PCS signals are often not optimally received by the portable phone antenna.

Another specialized communication system that is becoming increasingly popular in the commercial trucking industry is provided by Orbcomm L.P. through its Orbcomm® system. The Orbcomm® system uses 28 low-earth-orbit satellites to track mobile equipment such as trucks and trailers, as a well as other earth-bound mobile assets. Orbcomm® transmits over the 148–150 MHz band and receives at 137–138 MHz, both ranges being higher than AM/FM but lower than WB. There remains a need to minimize the number of antennas and the tuning requirements of a mobile antenna while maximizing and distributing the number of frequencies that can be received from the antenna through a multiplexer.

SUMMARY OF THE INVENTION

These and other problems of the prior art are overcome by multiplex circuitry that includes a first connection terminal for connection to a first antenna. The first antenna is arranged to receive and transmit signals in a first frequency range. A second connection terminal is provided for connection to a second antenna. The second antenna is arranged to receive and transmit signals in a second frequency range, discrete from and higher than the first frequency range. Preferably the first and second antennas are separate physical antennas, although they can be merely electrically separate on the same physical apparatus.

The multiplexer has a third connection terminal for connection to a signal processor adapted to receive the first frequency range, and a fourth connection terminal for connection to a signal processor adapted to receive the second frequency range. A first filter is connected between the first connection terminal and the fourth connection terminal to exclude signals outside of the first frequency range, and a second filter is connected between the second connection terminal and the third connection terminal to exclude signals outside the second frequency range.

Preferably, the first and second filter circuits each include a capacitor and an inductor in series. Also, the second filter circuit can have another capacitor in parallel with the inductor.

The invention thus provides for the reception and/or transmission of AM, FM, CB, WB, standard cellular telephone signals, PCS telephone signals, and Orbcomm®, while enabling switching between choice of frequencies without any substantial losso degradation of signal. In one particular embodiment of the invention, a multiplexer is provided having a first connection to AM/FM/WB, a second connection to CB, a third connection to standard cellular frequencies, and fourth connection to Orbcomm. Advantageously, no switching or changes in connections are required on the part of the person switching between the respective frequencies.

BRIEF DESCRIPTION OF THE DRAWING

An illustrative embodiment of the invention is described below with reference to the drawing in which.

DETAILED DESCRIPTION

Figure 1:
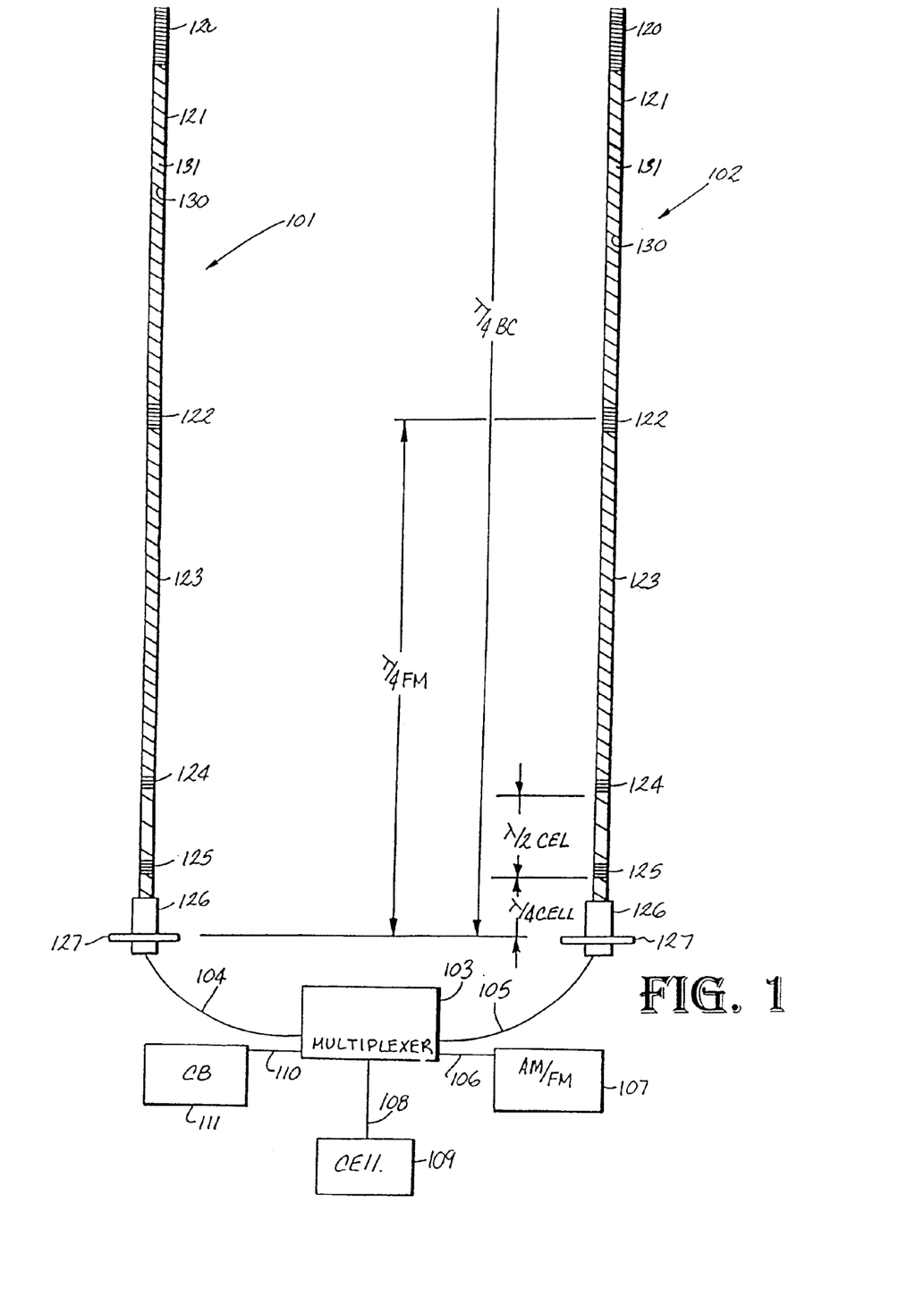
FIG. 1 is a diagrammatic representation of a dual CB/AM/FM/WB/cellular telephone antenna system incorporating the principles of the invention.

FIG. 1 shows an antenna system 100 comprising a pair of identical antennas 101, 102. The antennas 101, 102 are connected to a multiplexer 103 via conductors 104, 105, respectively. The multiplexer 103 serves to connect the antennas to an AM/FM receiver 107 via conductor 106, to cellular telephone equipment 109 via conductor 108 and to a CB transceiver 111 via conductor 110. Each of the antennas is mounted by means of a mounting nut 126 on a bracket 127 which may, for example, be a side mirror mounting bracket of a truck. The overall antenna is preferably on the order of 54 inches in length. The antennas each comprise an enamel coated conductive antenna wire 130 wound around an essentially cylindrically shaped core 131. The core 131 may be a solid core of fiberglass or the like material having a diameter of ¼ inch. The wire of each antenna extends continually from the top of the core 131 to the mounting nut 126 where each antenna is connected to multiplexer 103 via one of the conductors 104, 105. The wire section from the mounting nut 126 to the upper end of the rod 131 has an electrical length of one-quarter wavelength in the CB frequency range. Similarly, antennas are described in Application Ser. No. 08/452,079, filed May 26, 1995, entitled "Multiband Antenna System" which is incorporated by reference herein.

The overall length of the wire 130 includes a tightly wound loading coil 120 at the top of each antenna as well as the wire section 121 extending between the loading coil 120 and an FM self-resonant circuit 122. In the FM self-resonant circuit the successive turns of the wire 130 are immediately adjacent each other. The successive turns of the wire 130 are spaced apart in the area 123 between the FM self-resonant circuit 122 and a cellular self-resonant circuit 124. In the cellular self-resonant circuit 124, as in the FM self-resonant circuit 122, the successive turns of the wire 130 are disposed immediately adjacent each other. The electrical length of the wire section from the mounting nut 126 to the lower end of the FM self-resonant circuit 122 has an electrical length of one-quarter wavelength in the FM frequency range. The wire section between the cellular self-resonant circuit 124 and the mounting nut 126 has an electrical length of three-quarter wavelength in the cellular frequency range. Since the cellular antenna is so short physically compared with either the FM or CB quarter-wave antenna, a phase reversing coil 125 is placed a quarter-wave above the feed and a half-wave below the cellular frequency self-resonant circuit. This allows the current between the phase reversing coil and cellular frequency self-resonant circuit to be in phase with the current on the quarter-wave radiating element between the phase reversal coil and feed point, thus enhancing the antenna gain at cellular frequencies. A phase inverter coil 125 is disposed in the cellular section of the antenna and serves to provide phase inversion, as is common in cellular telephone antennas.

Figures 2, 3:
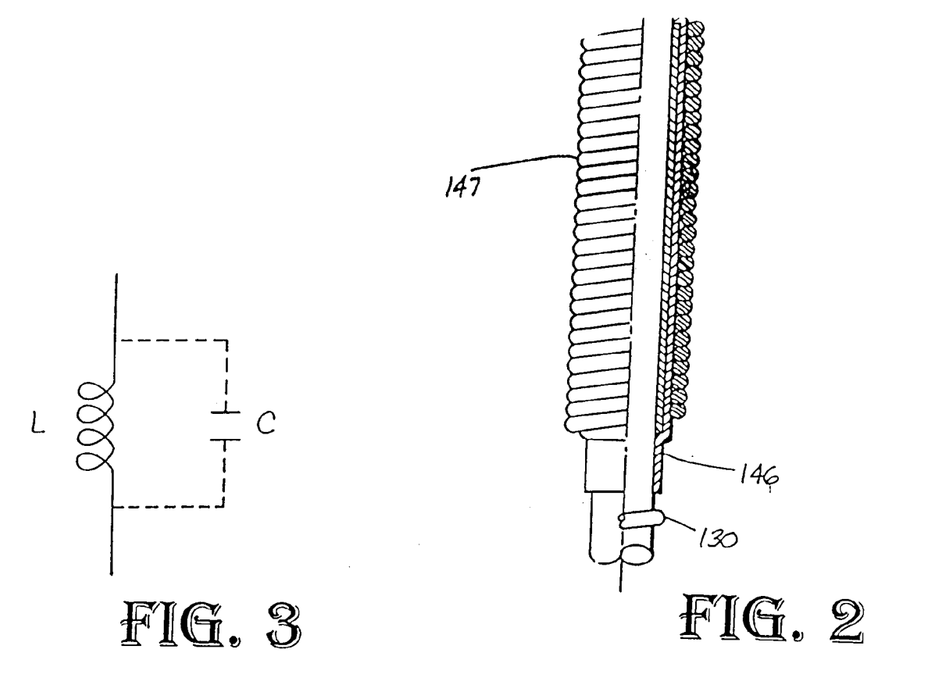
FIG. 2 is a partially cutaway view of a self-resonant circuit in accordance with the invention.
FIG. 3 is an equivalent circuit representation of the self-resonant circuit of FIG. 2.

FIG. 2 shows the FM self-resonant circuit 122 in partial cut away. Shown in FIG. 2 is a section of the fiberglass core 131 around which the antenna wire 130 is wound. In the area of the FM self-resonant circuit the antenna wire is wound to form a coiled section 147 with the successive turns of the coil immediately adjacent one another.

A thin walled brass tube 145 is extended over the core 131 with its horizontal centerline at the electrical length from the lower end of the antenna equivalent to one-quarter wavelength in the FM frequency range, at approximately 100 MHz. A thin dielectric film 146 is applied over the exterior surface of the tube 145 and the antenna wire 130 is tightly wound over the dielectric film.

FIG. 3 shows an equivalent circuit of the FM self-resonant circuit 122 which includes an inductance L introduced by the tightly wound coiled section 147 and a capacitance C resulting from the tube 145 disposed within the coiled section and separated from the coiled section 147 by the dielectric 146. There is no direct electrical connection between the antenna wire 130 and the tube 145 and the capacitance between the antenna wire 130 and the tube 145 is essentially only distributed (or stray) capacitance. For this reason, the connections between the coil L and capacitor C, in FIG. 3, are shown in the form of dotted lines.

An antenna incorporating an FM self-resonant circuit in accordance with the invention may be readily constructed by sliding the metallic tube, having an inner diameter slightly larger than the core, over the core and taping a thin layer of dielectric material over the metallic tube prior to coiling the antenna wire on the core. In one particular embodiment, the brass tube 145 is approximately 2 inches long and has walls that are 0.012 inches thick. The dielectric film in this particular embodiment is a single-layer Kapton® film with a thickness in the range of 0.002 to 0.004 inches. The antenna wire 130 may be a 20-gauge, enamel-coated wire or the like which is tightly wound to form the coiled section 147 with on the order of 35 to 40 turns over the 2 inch length of the tube 145. This arrangement has been found to be self-resonating at approximately 100 MHz. The dimensions of the tube and dielectric and the antenna wire as well as the number of turns in the coiled section 147 clearly can be varied and adjusted by one skilled in the art to obtain the resonance at the desired frequency and the above-noted dimensions are provided only as an exemplary embodiment.

Figure 4:
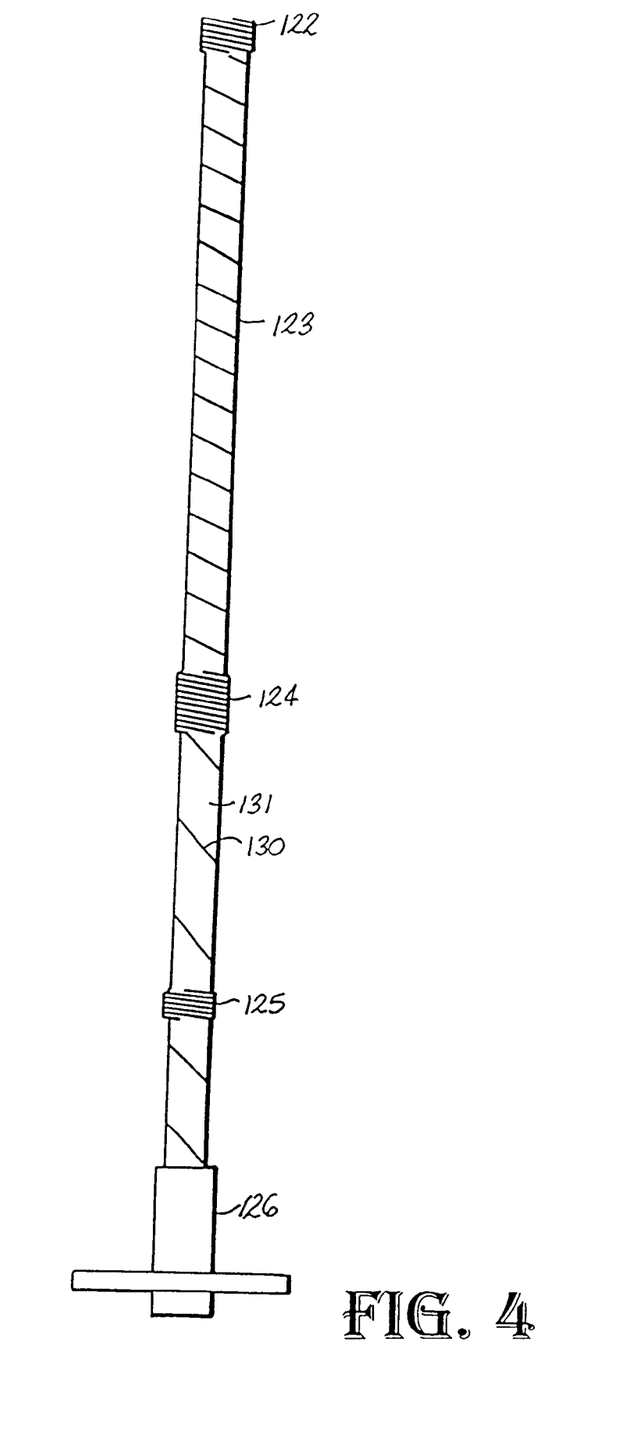
FIG. 4 is an enlarged breakaway view of the cellular telephone portion of one of the antennas of FIG. 1.

FIG. 4 is an enlarged view of the lower section of one of the antennas 101, 102 showing the portion of the antennas below the FM self-resonant circuit 122.

Successive turns of the wire 130 below the FM self-resonant circuit 122 are wound around core 131 with approximately three inches per revolution and above the FM selfresonant circuit 130 are wound around the core 131 with approximately 1 to 1.5 inches per revolution. The cellular self-resonant circuit 124 consists of three to five turns of the enamel coated wire 130 with successive turns of the wire disposed immediately adjacent one another and wound on the core 131 without the use of a tubular section and dielectric employed in the FM self-resonant circuit 122, as shown in FIG. 2. The adjacent turns of the wire 130 in the cellular self-resonant circuit 124 provide sufficient stray or distributed capacitance to form an L-C circuit that resonates at cellular frequencies. In this manner, the upper portion of the antenna above the cellular self-resonant circuit is isolated from the cellular part of the antenna. Further provided in the cellular section of the antenna is a phase inversion coil 125 consisting of approximately six to eight turns of the wire 130 with adjacent turns of the wire spaced apart by a distance approximately equal to two times the diameter of the wire. The coil 125 performs the same function as a standard phase inversion coil typically employed in a cellular telephone antenna.

To obtain sufficient length for the cellular antenna for appropriate signal reception, the wire 130 in the cellular area could be essentially a straight wire. However, to facilitate manufacture of the combined cellular AM/FM/CB/cellular antenna, the wire 130 is wound around the core 131 in the cellular area with adjacent windings spaced apart by a convenient distance. In the manufacturing process, the wire 130 is wound around the core 131 while controlling the number of windings per unit length in the various different sections of the antenna. Allowing the wire in the cellular antenna portion to be wound around the core, allows the antenna to be manufactured by a single wire winding operation while varying the pitch of the wire in the various areas on the core. The overall length of the antenna is typically 54 inches. To provide sufficient electrical length of the antenna wire 130 for a quarter wavelength antenna in the CB frequency range, the wire is wound in a loading coil 120.

Figure 5:
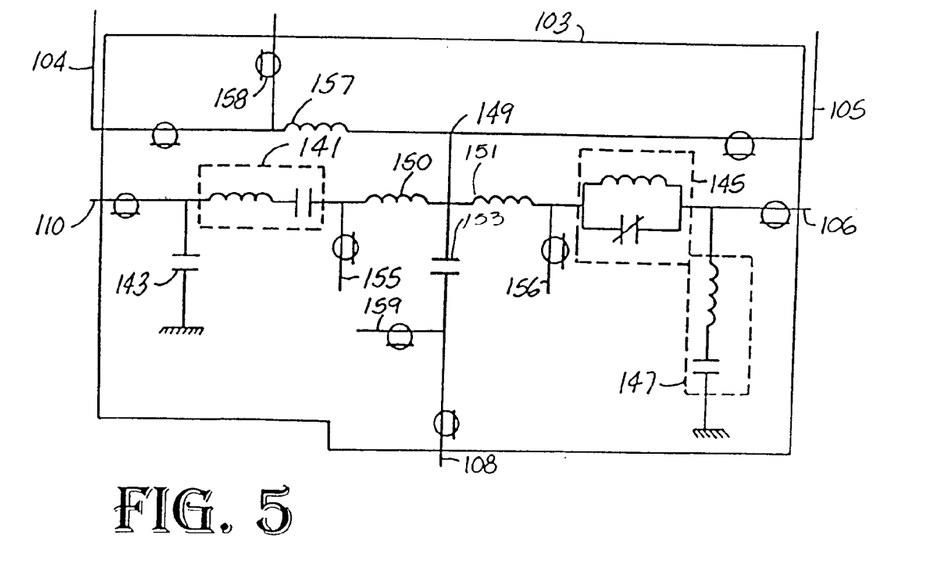
FIG. 5 is a circuit diagram of the multiplexer of FIG. 1.

FIG. 5 schematically shows the circuit of the multiplexer 103 which provides an interface to the CB transceiver 111 via conductor 110, to AM/FM receiver 107 via conductor 106 and to the cellular equipment 109 via conductor 108. The series L-C circuit 141 offers a low impedance to the CB signal and a high impedance to the AM/FM signal so as not to load the AM/FM receiver. The parallel L-C circuit 145 provides a high impedance at 27 MHz, thereby isolating the CB transmitter from the AM/FM receiver. A pair of coils 150, 151 connected to node 149, at which the antenna conductors 104, 105 are joined, provide high impedance to signals in the cellular frequency range. In this manner, the cellular frequency signals and AM/FM signals are blocked from the CB transceiver 111 and cellular frequency and CB signals are blocked from the AM/FM receiver 107. A capacitor 153 is disposed between the node 149 and conductor 108 connected to the cellular telephone equipment 109. The capacitor 153 provides a high impedance at the CB and AM/FM frequencies and a low impedance at the cellular frequencies which isolates the cellular telephone equipment 109 from CB and AM/FM signals. The inductors 150, 151 are self resonant at approximately 850 MHz to maintain a high impedance for cellular telephone frequency signals so as to isolate the cellular signals from the CB and AM/FM radios and may not be needed in all installations. The capacitor 153 blocks the lower frequencies from the cellular telephone and offers a low impedance to cellular telephone frequencies when the capacitor is connected in series with an inductor having an inductance of approximately 10 nanohenrys (approximately ½" of standard connection wire). The series L-C circuit 147 serves to shunt any CB signal passing through or bypassing the circuit 145 to ground. The capacitor 143 aids in matching the antenna to the CB transceiver 111. The conductors 104, 105, 106, 108 and 110 are preferably coaxial conductors. Referring again to FIG. 5, a coaxial stub 155 is shown connected between the L-C circuit 141 and the coil 150. Similarly coaxial stub 156 is shown connected between the coil 151 and the L-C circuit 145. The two open, quarter-wavelength coaxial stubs present a low impedance at the cellular telephone frequencies thereby providing additional isolation, if needed. If required, an inductor 157 may be connected between the conductor 104 and the node 149. The inductor 157 is self resonant at cellular telephone frequencies and provides isolation between the two antennas 101, 102 in the event that the antennas are positioned such that interference of cellular signals in the two antennas tends to occur.

To provide additional isolation, an open coaxial stub 158 of a quarter wavelength at a cellular frequency, blocking cellular frequency signals may be connected to the conductor 104. A shorted coaxial stub 159 having an electrical length of one-quarter wavelength of signals in the cellular frequency range provides a low impedance to AM/FM and CB signals to further isolate the cellular radio apparatus from these signals when needed.

Figure 6:
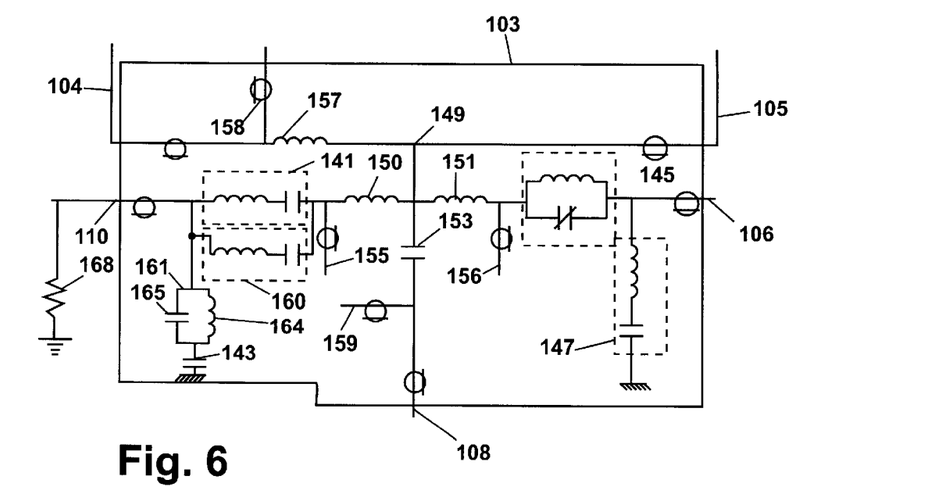
FIG. 6 is a circuit diagram representation of an alternate embodiment of he multiplexer of FIG. 1.

The circuit diagram of FIG. 6 is similar to that of FIG. 5 and further includes circuitry for transmitting signals of frequencies falling within the weather band frequency spectrum, e.g. frequencies around 162 MHz, to the conductor 110, connectable to the CB transceiver 111. The circuit of FIG. 6 includes a series L-C circuit 160 and a parallel L-C circuit 161. The series L-C circuit 160 offers low impedance to signals of frequencies in the weather band and is connected in parallel with the series L-C circuit 141. The two circuits 141 and 160 provide parallel paths from the antennas 104, 105 to the CB receiver 111 (shown in FIG. 1). Shown in FIGS. 5 and 6 is a capacitor 143 that serves to aid in matching the antenna to the CB transceiver 111, and may not be required on all installations. The parallel L-C circuit 161 is formed of capacitor 165 and inductor 164. The circuit 161 is shown in FIG. 6 as connected between the conductor 110 and capacitor 143. Typically, capacitor 143 will be used only on vehicles requiring additional impedance matching. When the capacitor 143 is used, however, the signals in the weather band frequency range passed by the circuit 160 may be degraded by the presence of the capacitor 143. For that reason, a parallel L-C circuit 161 has been added and is specifically designed to block signals in the weather band frequency range, i.e., approximately 162 MHz.

Referring again to FIG. 6, weather band frequency signals received at the node 149 in the circuitry of FIG. 6 will be divided between the CB/WB radio apparatus 110 and the AM/FM/WB radio apparatus 106. If one of the conductors 106, 110 is not connected to radio apparatus, the signal at the other terminal may be degraded significantly depending on the length of the cable. The addition of a 50 Ohm resistor between the unconnected terminal and ground has been found to significantly improve the reception of the weather band signal at the connected apparatus. By way of example, a resistor 168 is shown connectable to terminal 110 in the event that no CB transceiver is connected to terminal 110.

Figure 7:
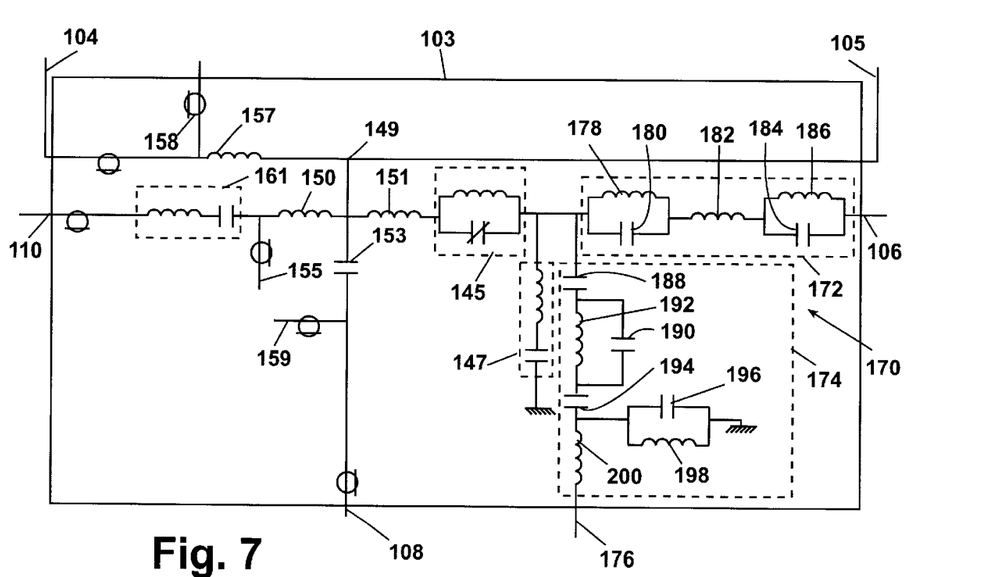
FIG. 7 is a circuit diagram of the multiplexer of FIG. 6 in combination with a multiplexer circuit adapted for Orbcomm®.

Shown in FIG. 7 is another embodiment of the multiplexer 103 of FIG. 6, together with a further multiplexer circuit 170 for transmitting signals at the Orbcomm frequencies of 148–150 MHz and receiving Orbcomm signals at 137–138 MHz through the antenna connections 104, 105. The circuit 170 comprises an isolation matching circuit 172 for isolating the Orbcomm frequencies from the AM/FM/WB signal and an isolation matching circuit 174 for passing the Orbcomm signals to and from a terminal 176. In the isolation circuit 172, a parallel resonant L-C circuit comprising inductor 178 and capacitor 180 are chosen to resonate at 149 MHz, which is mid-band for the Orbcomm transmission frequencies. An inductor 182 and a capacitor 184 comprise a series L-C circuit to improve the impedance match at the FM and WB frequencies. The inductor 186 is required to pass the AM frequency band and has minimal effect on the FM and WB frequencies.

To prevent loading between the Orbcomm frequencies and the AM/FM/WB signal, the isolation matching circuit comprises a series resonant circuit 174 formed by capacitors 188, 190 and inductor 192 that matches the Orbcomm frequencies.

The series capacitor 188 blocks the AM signal and the parallel resonant circuit of capacitor 190 and inductor 192 blocks the FM and WB signals. With the capacitors 194, 196 and inductors 198, 200 making up impedance matching for the 137–138 and 148–150 MHz frequency ranges, the Orbcomm frequencies are passed to the terminal 176.

Figure 8:
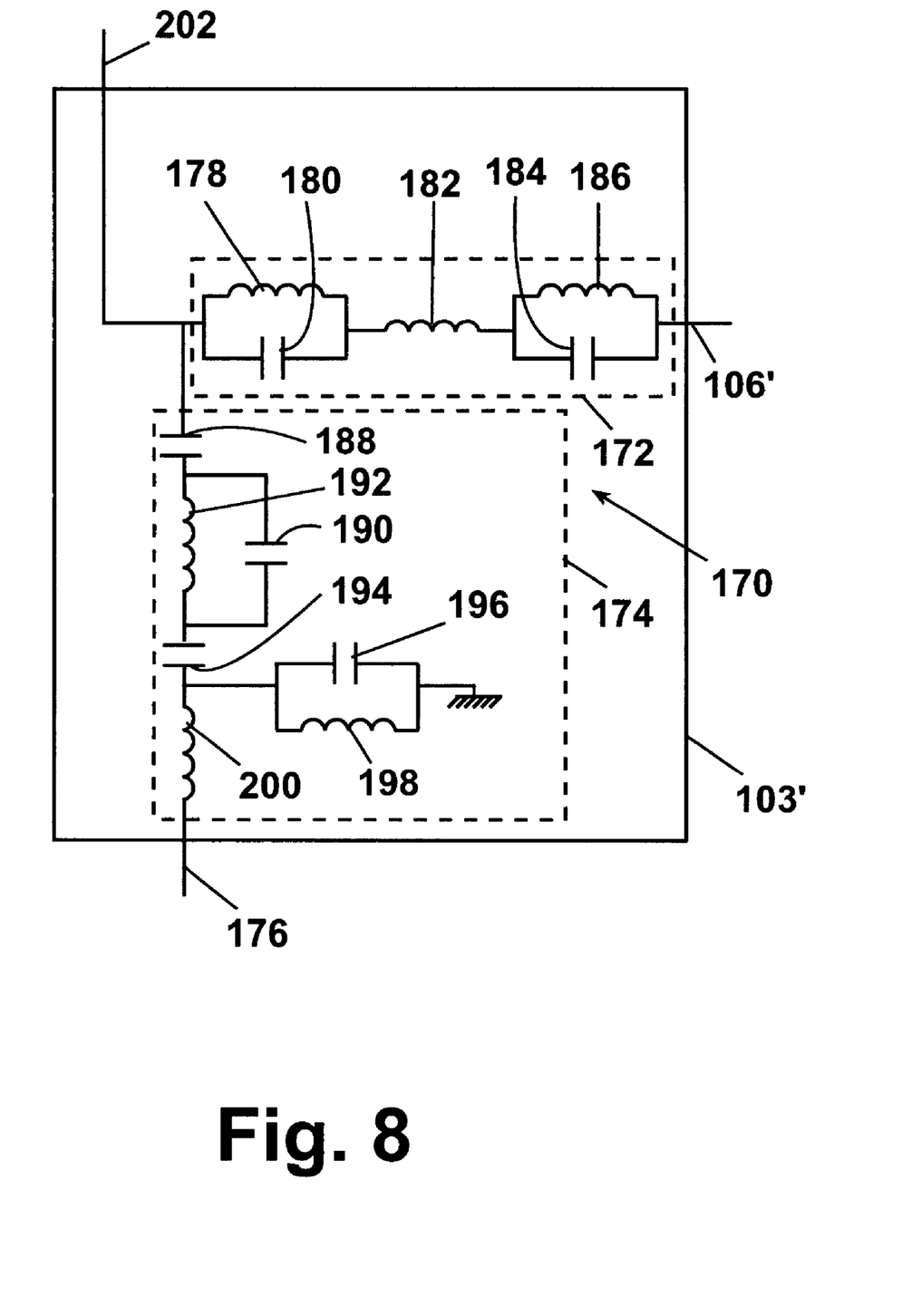
FIG. 8 is a circuit diagram of an alternative embodiment of a multiplexer according to the invention.

It is anticipated that a user's satellite equipment for processing and displaying data based on the Orbcomm signals would be simply connected to the terminal 176 without the need for another antenna. It will be understood that a multiplexer in accordance with the invention can incorporate one or more of the disclosed circuits in various combinations. In addition, under some circumstances no more than a single antenna may be necessary. For example, FIG. 8 illustrates a multiplexer for receiving AM/FM signals and transceiving satellite signals at frequencies such as the Orbcomm ranges, all from a single AM/FM antenna. In FIG. 8, elements having like characteristics to those of FIG. 7 are shown with like numerals. Multiplexer 103 in FIG. 8 connects to a single antenna 202 adapted to receive AM/FM/WB and Orbcomm signals, not unlike one of the antennas illustrated in FIGS. 1–4. Two outputs from the multiplexer 103' include AM/FM/WB at 106' and Orbcomm at 176. In this embodiment, the multiplexer 103' can be a single add-on to the connector 106 of the multiplexer in FIG. 5. Typically, a low loss cable should be employed for any conductor between the multiplexer 170 and other equipment such as a cellular telephone or satellite signal processing equipment.

What is claimed is:

1. A multiplexer circuit comprising:

a first connection terminal for connection to a first antenna arranged for transmitting and receiving signals in a first frequency range;

a second connection terminal for connection to a second antenna arranged for transmitting and receiving signals in a second frequency range, discrete from and higher than said first frequency range; and a third connection terminal for connection to a signal processor adapted to receive the first frequency range;

a fourth connection terminal for connection to a signal processor adapted to receive the second frequency range;

said multiplexer circuit further comprising a first filter circuit connected between said first connection terminal and said fourth connection terminal for excluding signals outside of said first frequency range and a second filter circuit connected between said second connection terminal and said third connection terminal for excluding signals outside said second frequency range.

2. The multiplexer circuit in accordance with claim 1 wherein said first filter circuit comprises a first capacitor and a first inductor connected in series with said first capacitor and wherein said second filter circuit comprises a second capacitor and a second inductor connected in series with said second capacitor.

3. The multiplexer circuit in accordance with claim 2 wherein said second filter circuit further comprises a third capacitor connected in parallel with said second inductor and wherein said second filter circuit is operative to exclude signals in said second frequency range.

* * * * *